United States Patent
Yabuki et al.

(10) Patent No.: US 7,318,916 B2
(45) Date of Patent: Jan. 15, 2008

(54) SEMICONDUCTIVE GAAS WAFER AND METHOD OF MAKING THE SAME

(75) Inventors: Shinji Yabuki, Hitachi (JP); Michinori Wachi, Hitachi (JP); Kouji Daihou, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 66 days.

(21) Appl. No.: 11/341,847

(22) Filed: Jan. 30, 2006

(65) Prior Publication Data

US 2006/0169944 A1 Aug. 3, 2006

(30) Foreign Application Priority Data

Jan. 31, 2005 (JP) ............................. 2005-022843
Dec. 7, 2005 (JP) ............................. 2005-353624

(51) Int. Cl.
*C01B 33/26* (2006.01)
(52) U.S. Cl. .................... 423/328.2; 117/17; 117/18
(58) Field of Classification Search ............... 117/17, 117/19; 423/328.2
See application file for complete search history.

(56) References Cited

U.S. PATENT DOCUMENTS 6,866,714 B2 * 3/2005 Kawase et al. ............. 117/206

FOREIGN PATENT DOCUMENTS

JP 11-268997 10/1999

* cited by examiner

*Primary Examiner*—Felisa Hiteshew
(74) *Attorney, Agent, or Firm*—McGinn IP Law Group, PLLC

(57) ABSTRACT

A semiconductive GaAs wafer has a diameter of 4 inches or more, and an in-wafer plane dislocation density of 30,000/cm$^2$ or more and 100,000/cm$^2$ or less. A semiconductive GaAs wafer is made by growing a GaAs single crystal under a temperature gradient of 20° C./cm or more and 150° C./cm or less formed in the crystal so that the semiconductive GaAs wafer has an in-wafer plane dislocation density of 30,000/cm$^2$ or more and 100,000/cm$^2$ or less.

4 Claims, 4 Drawing Sheets

SEMICONDUCTIVE GAAS WAFER AND METHOD OF MAKING THE SAME

The present application is based on Japanese patent application No. 2005-353624, the entire contents of which are incorporated herein by reference.

BACKGROUND OF THE INVENTION

1. Field of the Invention

This invention relates to a semiconductive GaAs wafer and, in particular, a semiconductive GaAs wafer that the incidence of a slip dislocation can be reduced in heat treatment such as an activation annealing after an ion implantation to be conducted in the process of fabricating an electronic device by using the GaAs wafer. Also, this invention relates to a method of making the semiconductive GaAs wafer.

2. Description of the Related Art

Semiconductive GaAs wafers are made generally by the Liquid Encapsulated Czochralski (LEC) method, or the vertical melt method such as vertical bridgeman (VB) and vertical gradient freeze (VGF).

A method of making a GaAs single crystal by the LEC method will be explained below referring to FIG. 1.

A GaAs single crystal growth equipment 1 for the LEC method comprises a chamber 2 which composes a furnace body, a pulling shaft 3 for pulling the crystal, a crucible 5 which is a container for raw material, and a crucible shaft 4 which supports the crucible 5.

In operation, Ga, As and boron trioxide 6 which prevents the volatilization of As are charged in the crucible 5 which is generally made of PBN (pyrolytical boron nitride). Then, the crucible 5 is placed in the chamber 2. A seed crystal 7 as a crystal source is attached to the tip of the pulling shaft 3. The seed crystal 7 generally has a (100) plane to face the GaAs melt.

After the raw materials are placed in the chamber 2, the chamber 2 is vacuumed and then charged with inert gas. Then, a resistance heater 8 built in the chamber 2 is fed with current to increase the inside temperature of the chamber 2 so that Ga and As are reacted to synthesize GaAs. Then, by further increasing the temperature, GaAs melt 9 is obtained. Then, the pulling shaft 3 and the crucible shaft 4 are rotated inversely to each other. In this state, the pulling shaft 3 descends until the seed crystal 7 attached to the tip thereof contacts the GaAs melt 9. Then, the pulling shaft 3 is raised at a constant rate while lowering gradually the setting temperature of the resistance heater 8. Thereby, the crystal diameter increases gradually from the seed crystal to form a crystal shoulder. When a target crystal outside diameter is obtained after forming the crystal shoulder, its shape control is conducted to keep the outside diameter to obtain a GaAs single crystal 10.

Next, a method of making a GaAs single crystal by the vertical melt method will be explained below referring to FIG. 2.

A GaAs single crystal growth equipment 21 for the vertical melt method (such as the VB method or VGF method) comprises a chamber 22 as a furnace body, and a crucible shaft 24 which supports a crucible 25 which is a container for raw materials.

In operation, GaAs polycrystal and boron trioxide 26 which prevents the volatilization of As are charged in the crucible 25 which is generally made of PBN (pyrolytical boron nitride) Then, the crucible 25 is placed in the chamber 22. A seed crystal 27 as a crystal source is attached inside a reduced diameter part at the bottom of the crucible 25. The seed crystal 27 generally has a (100) plane to face the GaAs melt.

Then, the chamber 22 is vacuumed and then charged with inert gas. Then, a resistance heater 28 built in the chamber 22 is fed with current to increase the inside temperature of the chamber 2 while forming a temperature gradient that temperature increases from the bottom toward the top. Thereby, the GaAs polycrystal is melted to have GaAs melt 29. Then, the seeding is conducted such that the furnace temperature is further increased until the GaAs melt 29 contacts the seed crystal 27 attached to the bottom of the crucible 25.

Then, in case of the VB method, the crucible 24 descends at a constant rate while keeping the setting temperature of the resistance heater 28 such that the GaAs melt 29 is solidified from the seed crystal 27 to obtain a GaAs single crystal. In case of the VGF method, after the seeding, the setting temperature of the resistance heater 28 lowers at a constant rate without moving the crucible shaft 24 such that the GaAs melt 29 is solidified from the seed crystal 27 to obtain a GaAs single crystal.

The LED method and the vertical melt method (VB or VGF) have the following advantage and disadvantage.

In case of the LEC method, the crystal growth is conducted under the condition of a steep temperature gradient. Therefore, the LEC method is suited to increase the rate of crystal growth since the cooling of crystal can be easy conducted, and it is very advantageous in throughput. However, due to the crystal growth in the steep temperature gradient, the LEC method tends to have a dislocation density in wafer plane (herein also called 'etch pit density' (EPD)) higher than the VB and VGF methods such that its average in-plane dislocation density is 50,000 to 100,000/cm$^2$ for a wafer with a diameter of $\phi$15.24 cm (=6 inches). Meanwhile, the influence of the dislocation density in a semiconductive GaAs wafer on the characteristics of an electronic device is still unknown. Thus, a conclusion is not obtained that a low dislocation density results in a good characteristic.

In case of the VB and VGF methods, the crystal growth is conducted under the condition of a gradual temperature gradient. Therefore, in contrast to the LEC method, the VB and VGF methods are not suited to increase the rate of crystal growth, and they are not advantageous in throughput. However, they are suited to lower its dislocation density in wafer plane (i.e, its average in-plane dislocation density is about 10,000/cm$^2$ for a wafer with a diameter of $\phi$15.24 cm (=6 inches).

On the other hand, the semiconductive GaAs wafer is used as a substrate material for electronic devices that require a high-speed operation and low power consumption. The semiconductive GaAs wafer for an electronic device's substrate supplied to an electronic device manufacturer is subjected to annealing (thermal treatment) such as activation annealing after ion implantation in the process of fabricating the electronic device.

The ion implantation is intended to enhance the conductivity of a wafer by implanting, e.g., Si ion onto the GaAs wafer. However, in the ion implantation, the lattice arrangement of crystal must be distorted so that the conductivity cannot be enhanced sufficiently. Thus, the activation annealing is conducted to rearrange suitably the crystal lattice.

The annealing is conducted independently under the conditions of each electronic device manufacturer. In general, it is conducted such that the wafer is rapidly heated to about 500 to 900° C. and then cooled rapidly.

In the annealing techniques, an attempt is conducted that a GaAs crystal wafer made by the vertical melt method is used as a substrate for the ion implantation since it has a low dislocation density and residual strain as compared to that made by the LEC method (see, e.g., JP-A-11-268997). However, when a crystal is actually made by the vertical melt method in mass production process, the crystal may have unstable characteristics rather than GaAs crystal (LED crystal) made by the LEC method. Further, when conducting the same heat treatment as conducted for the GaAs crystal made by the LEC method to the GaAs crystal made by the vertical melt method, especially the crystal with a diameter of more than 7.62 cm (=3 inches) may have an increased dislocation density and residual strain and have a uniformity mechanism different from the LEC crystal. Thus, JP-A-11-268997 discloses a method that a high-quality GaAs wafer practically usable for the device fabrication can be obtained by specifying the manufacturing conditions of GaAs crystal and the crystalline characteristics to have more stable and uniform electrical characteristics, and optimal heat treatment conditions.

However, the conventional methods have the following problems.

In fabricating an electronic device by using as its substrate the GaAs crystal made by the LEC method or the vertical melt method (VB or VGF), a slip dislocation may be generated at the GaAs wafer in the process of activation annealing after the ion implantation. Therefore, the device cannot be used as a product.

The main reason for generating the slip dislocation can be nonuniformity of temperature in wafer plane during the annealing. In this regard, each electronic device manufacturer tries to improve the annealing technique.

However, since in recent years the diameter of wafer is increased such that the mainstream diameter of GaAs wafer changes from conventional one, φ10.16 cm (=4 inches) to φ15.24 cm (=6 inches), a high-level control is needed for uniformity of temperature in wafer plane during the annealing than before. Thus, the uniformity of temperature in wafer plane is more important problem than before.

JP-A-11-268997 tries to use the GaAs crystal wafer made by the vertical melt method as a substrate for the ion implantation since it has a low dislocation density and residual strain as compared to that made by the LEC method.

However, as described earlier, the crystal made by the vertical melt method may have unstable characteristics rather than GaAs crystal (LED crystal) made by the LEC method. Further, the crystal made by the vertical melt method is not suited to the same heat treatment as conducted for the GaAs crystal made by the LEC method. Therefore, optimal heat treatment conditions needs to be further developed.

Further, the most important point is that even when the crystal made by the vertical melt method has a residual strain lower than the LEC crystal, it is not directly established that the former can offer a low slip dislocation. As the result of the inventors' researches, the slip dislocation after the activation annealing is not caused by only the residual strain.

SUMMARY OF THE INVENTION

It is an object of the invention to provide a semiconductive GaAs wafer that the slip dislocation can be prevented from occurring in heat treatment such as activation annealing after the ion implantation by limiting the dislocation density in wafer plane (i.e., EPD value) and residual strain of the GaAs crystal obtained by the LEC method or vertical melt method (VB or VGF method) into a specific range.

It is a further object of the invention to provide the semiconductive GaAs wafer.

(1) According to one aspect of the invention, a semiconductive GaAs wafer comprises:

a diameter of 4 inches or more; and an in-wafer plane dislocation density of $30,000/cm^2$ or more and $100,000/cm^2$ or less.

In the above invention (1), the following modifications and changes can be made.

(i) The semiconductive GaAs wafer further comprises:

an in-wafer plane residual strain value |Sr−St| of $1.8 \times 10^{-5}$ or less, where the in-wafer plane residual strain value |Sr−St| is measured by using a photoelastic phenomenon that a polarization plane is rotated according to a intensity of a stress.

(2) According to another aspect of the invention, a method of making a semiconductive GaAs wafer comprises the step of:

growing a GaAs single crystal under a temperature gradient of 20° C./cm or more and 150° C./cm or less formed in the crystal so that the semiconductive GaAs wafer comprises an in-wafer plane dislocation density of $30,000/cm^2$ or more and $100,000/cm^2$ or less.

In the above invention (2), the following modifications and changes can be made.

(ii) The method further comprises the step of:

annealing the GaAs single crystal after the GaAs single crystal growing step.

(iii) The annealing step comprises a maximum attained temperature of 900° C. or more and 1150° C. or less so that the semiconductive GaAs wafer comprises an in-wafer plane residual strain value |Sr−St| of $1.8 \times 10^{-5}$ or less.

<Advantages of the Invention>

When an electronic device is fabricated by using as a substrate the semiconductive GaAs wafer of the invention, the defective product can be reduced significantly that is caused by a slip dislocation generated in a wafer heating treatment such as an activation annealing after ion implantation. Therefore, the yield of the electronic device can be enhanced.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Point of the Invention

Figure 1:
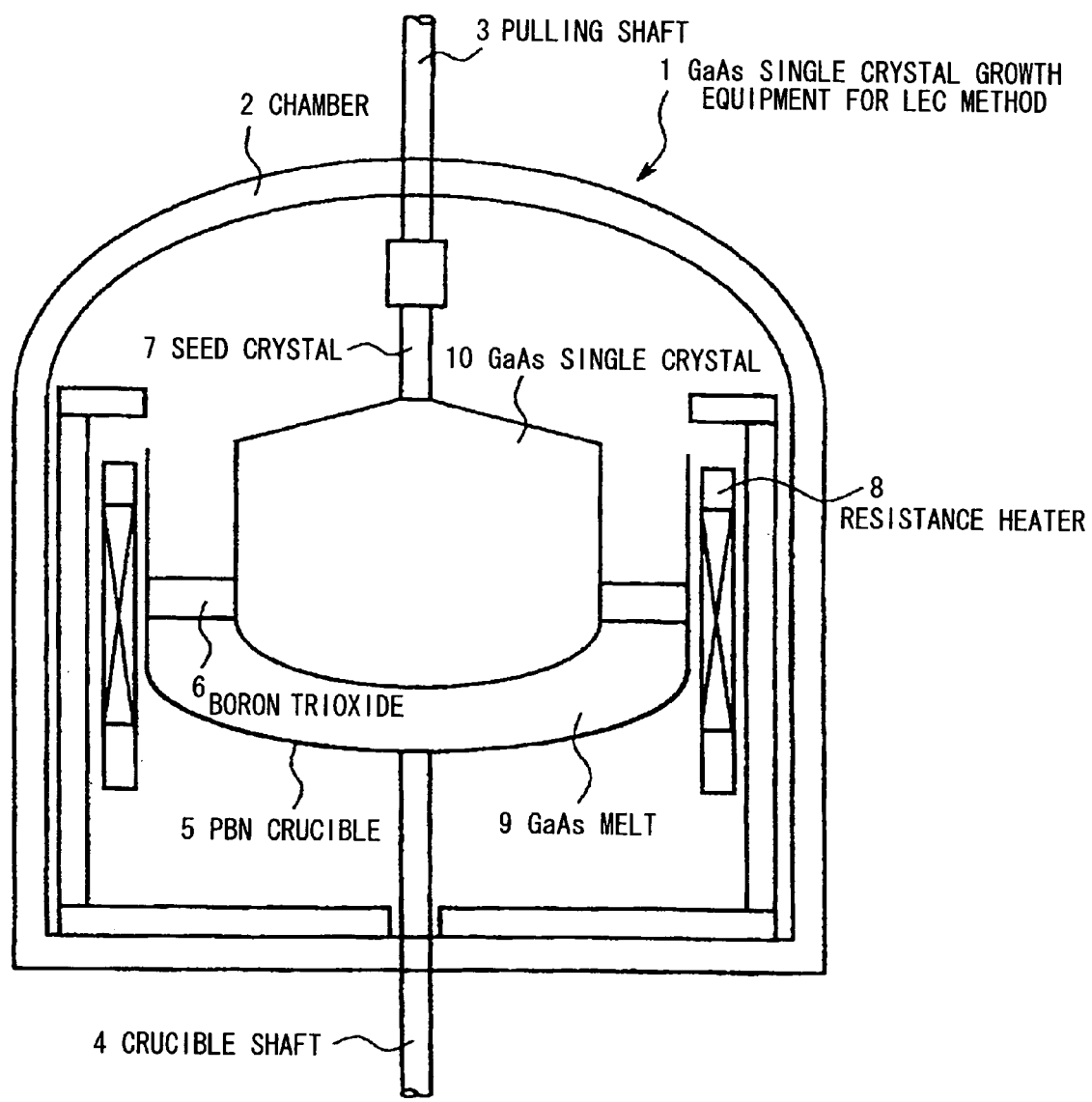
FIG. 1 is a schematic side view showing a GaAs single crystal growth equipment for the LED method.

Heretofore, the influence of the dislocation density in a semiconductive GaAs wafer on the characteristics of an electronic device is still unknown. Thus, the conclusion is not obtained that a low dislocation density results in a good characteristic.

As the result of inventors' researches in this regard, it is found that, when GaAs crystals have a same residual strain, the more dislocations a GaAs crystal has, the less it is likely to generate a slip dislocation after the activation annealing. In other words, when crystal wafers have a same residual strain, a crystal wafer with more dislocations made by the LEC method generates a slip dislocation less than a crystal wafer made by the vertical melt method (i.e., the VB or VGF method).

Thereupon, the inventors succeed in making a high-quality GaAs wafer available practically for the fabrication of an ion implantation substrate by limiting the characteristics of the GaAs crystal as below to reduce the incidence rate of slip dislocation even when being made by the LEC method.

One limitation is that a dislocation density in wafer plane (herein also called EPD) is to be $3\times10^4/cm^2 \leq EPD \leq 1\times10^5/cm^2$. The other limitation is that an average residual strain (|Sr–St|) measured by photoelastic determination is to be $1.8\times10^{-5}$ or less.

In contrast to this, JP-A-11-268997 teaches an EPD of $1\times10^4/cm^2$ or less and an average residual strain (|Sr–St|) measured by photoelastic determination of less than $1\times10^{-5}$. Thus, JP-A-11-268997 does not meet the limitations in regard to EPD.

The numerical limitations of the invention will be detailed below.

Range of EPD in Wafer Plane

The reason why the EPD in wafer plane of the invention is in the range of $3\times10^4/cm^2$ or more and $1\times10^5/cm^2$ or less is as follows.

Due to the existence of dislocation, plastic deformation is generated at the site of the dislocation as a general phenomenon observed in metals, and work hardening is obtained with the dislocations intricately-intertwined each other due to the plastic deformation. It is assumed that the work hardening results in enhancing strength against a thermal stress applied in the annealing so that the incidence of slip dislocation can be reduced. It is determined by the experiments that the work hardening is obtained by the EPD of $3\times10^4/cm^2$ or more. The reason why the EPD is to be $1\times10^5/cm^2$ or less is that the EPD more than $1\times10^5/cm^2$ causes a high incidence of semi-grain boundary and, therefore, it will be unavailable as a product.

Range of the Residual Strain Value |Sr–St| in Wafer Plane

The reason why the residual strain value |Sr–St| in wafer plane of the invention is in the range of $1.8\times10^{-5}$ or less is as follows.

From the inventors' recent researches, it is found that there is a correlation between the residual strain in wafer plane and the incidence of slip dislocation, and there is a tendency that the incidence of slip dislocation increases gradually as the residual strain increases. Further, it is found that a critical point exists at which the incidence of slip dislocation in the annealing increases abruptly. The residual strain is as defined above because the critical point is near |Sr–St|=$1.8\times10^{-5}$.

Method of Measuring the Residual Strain Value |Sr–St| in Wafer Plane

A method of measuring the residual strain can be, for example, a measuring method by using the photoelastic phenomenon described in Rev. Sci. Instrum., Vol. 64, No. 7, pp. 1815-1821 July 1993. The schematic measuring principle is that light from an infrared light source is irradiated to a wafer to detect a rotation angle of polarization plane in transmitted light thereof. The detected rotation angle allows the determination of a residual strain of the wafer since the rotation angle of polarization plane is determined by the residual strain of the wafer.

Definition of the Residual Strain Value |Sr–St|

The definition of the residual strain |Sr–St| will be explained below.

The residual strain of the wafer can be calculated as |Sr–St| that is an absolute value of the difference between Sr which is a strain in a radius direction of cylindrical coordinates and St which is a strain in a tangential direction of cylindrical coordinates. Thus, |Sr–St| is defined by a formula:

$$|Sr - St| = \frac{\lambda \delta}{\pi d n_0^3}\left(\left(\frac{\cos 2\psi}{p_{11} - p_{12}}\right)^2 + \left(\frac{\sin 2\psi}{p_{44}}\right)^2\right)^{1/2}$$

where $\lambda$: wavelength of light source, d: length of wafer n: refractive index $\delta$: phase difference generated by birefringence of sample $\phi$): main oscillation azimuth $p_{11}$, $p_{12}$ and $p_{44}$: photoelastic constant In the above formula, the residual strain |Sr–St| of a wafer can be calculated using $\delta$ and $\phi$ measured.

Range of Temperature Gradient in Crystal in the Process of Growing a GaAs Single Crystal The reason why, in the invention, the range of temperature gradient in crystal in the process of growing GaAs single crystal is 20° C./cm or more and 150° C./cm or less is as follows.

The dislocation generated in the crystal is influenced by thermal stress applied to the crystal during the growth. It is assumed that, when the crystal is subjected to thermal stress, i.e., under a temperature gradient, the dislocation is generated in a direction to relax the stress. Thereupon, the inventors get the idea that the EPD can be controlled to be $3\times10^4/cm^2$ or more and $1\times10^5/cm^2$ or less by providing a predetermined temperature gradient for the crystal during the growth.

In determining the optimum range of the temperature gradient in the crystal, experiments are conducted such that GaAs single crystal is grown by using the LEC method and the VB or VGF method while changing the temperature gradient in the crystal, and it is measured how the EPD value is varied.

Figure 4:
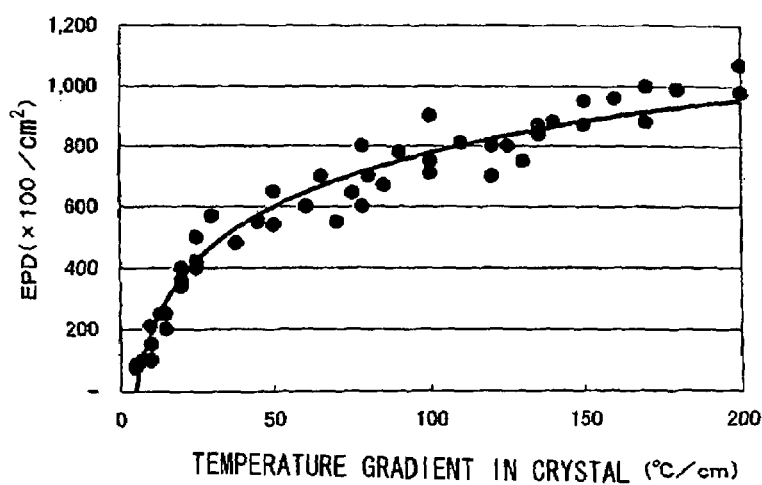
FIG. 4 is a graph showing the relationship between a temperature gradient in crystal and an EPD during crystal growth.

FIG. 4 is a graph showing the relationship between the temperature gradient in crystal and the EPD during the crystal growth.

In view of FIG. 4, it is found that the EPD is reproducibly in the range of 30,000/cm² to 100,000/cm² when the temperature gradient in the crystal is 20° C./cm or more and 150° C./cm or less.

Thus, in the invention, the range of temperature gradient in crystal in the process of growing GaAs single crystal to have a semiconductive GaAs wafer is determined to be 20° C./cm or more and 150° C./cm or less.

Preferred Range of Annealing Conditions

In the invention, it is preferred that, in annealing the GaAs single crystal after growing it in the above temperature gradient, the annealing conditions are a maximum attained temperature of 900° C. or more and 1150° C. or less and a temperature gradient of 0° C./cm or more and 12.5° C./cm or less in the crystal during the annealing. The reasons are as follows.

As described earlier, the EPD can be controlled to be $3 \times 10^4/cm^2$ or more and $1 \times 10^5/cm^2$ or less by setting the temperature gradient in the crystal in the process of growing the GaAs single crystal to be 20° C./cm or more and 150° C./cm or less. However, one problem is that a residual strain must be generated in the crystal since the thermal stress (i.e., temperature gradient) is intentionally applied to the crystal.

In this regard, experiments are conducted by the inventors such that, from the crystal treated in the experiments as shown in FIG. 4, only lots under the temperature gradient in the range of 20° C./cm or more and 150° C./cm or less are extracted and are formed into a wafer without applying any thermal treatment such as annealing after the growth, and its in-wafer plane residual strain |Sr–St| is measured.

Figure 5:
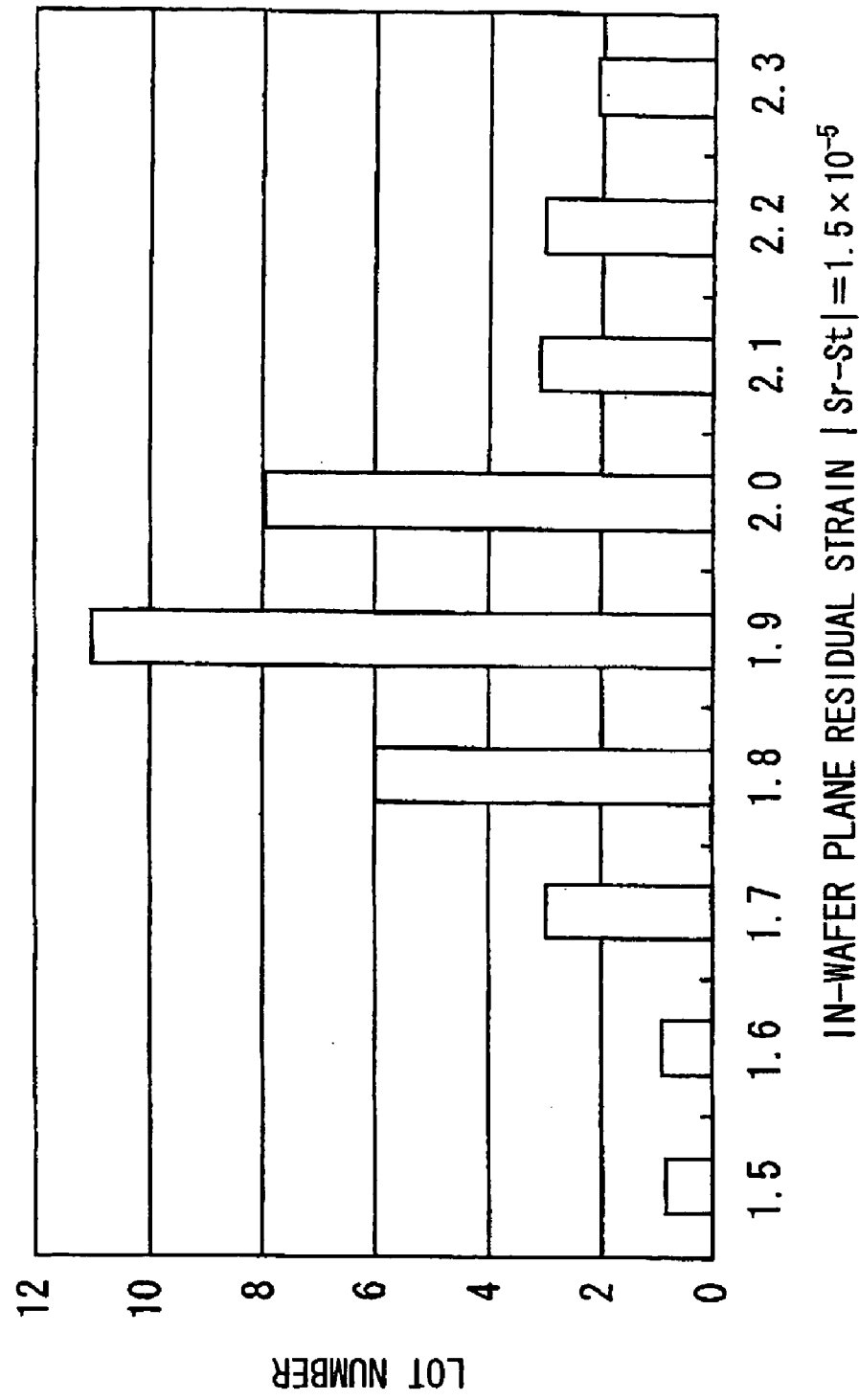
FIG. 5 is a graph showing the results of measuring an in-wafer plane residual strain of a wafer without annealing after being grown under a temperature gradient of 20° C./cm or more and 150° C./cm or less.

FIG. 5 is a graph showing the results of measuring an in-wafer plane residual strain of a wafer without annealing after being grown under a temperature gradient of 20° C./cm or more and 150° C./cm or less.

As a result, an average of |Sr–St| is determined $1.93 \times 10^{-5}$ which means that $|Sr-St| \leq 1.8 \times 10^{-5}$ is difficult to control reproducibly.

As the result of inventors' approaches, it is found that, even in the crystal grown under the temperature gradient of 20° C./cm or more and 150° C./cm or less, the residual strain in the crystal due to the thermal stress can be removed effectively and, thus, the in-wafer plane residual strain value can be controlled to be in the range of $1.8 \times 10^{-5}$ or less.

In optimizing the annealing conditions, viewing from the result of the residual strain measurement as shown in FIG. 5, three samples are provided $1.9 \times 10^{-5}$ (average), $2.3 \times 10^{-5}$ (maximum) and $1.5 \times 10^{-5}$ (minimum). The optimal conditions are obtained by measuring the change of residual strain in relation to parameters, a maximum attained temperature and a temperature gradient in the crystal during the annealing.

Tables 1, 2 and 3 show the residual strain value |Sr–St| of each sample after the annealing.

TABLE 1

Sample wafer with a residual strain value |Sr – St| of $1.9 \times 10^{-5}$ (average)

| | | Annealing maximum attained temperature (° C.) | | | | | | |
|---|---|---|---|---|---|---|---|---|
| | | 700 | 800 | 900 | 1000 | 1100 | 1150 | 1200 |
| Temperature gradient in crystal (° C./cm) | 0–2.5 | 1.9 | 1.8 | 1.3 | 1.0 | 0.8 | 0.8 | 0.7 |
| | 2.5–5.0 | 1.9 | 1.8 | 1.3 | 1.0 | 0.9 | 0.9 | 0.8 |
| | 5.0–7.5 | 1.9 | 1.9 | 1.4 | 1.2 | 1.0 | 0.9 | 0.9 |
| | 7.5–10.0 | 1.9 | 1.9 | 1.6 | 1.4 | 1.2 | 1.1 | NM |
| | 10.0–12.5 | 1.9 | 1.9 | 1.8 | 1.6 | 1.4 | 1.3 | NM |

TABLE 1-continued

Sample wafer with a residual strain value |Sr – St| of $1.9 \times 10^{-5}$ (average)

| | Annealing maximum attained temperature (° C.) | | | | | | |
|---|---|---|---|---|---|---|---|
| | 700 | 800 | 900 | 1000 | 1100 | 1150 | 1200 |
| 12.5–15.0 | 1.9 | 1.9 | 1.9 | 1.8 | 1.4 | 1.4 | NM |
| >15.0 | 1.9 | 1.9 | 1.9 | 1.8 | 1.7 | 1.7 | NM |

Notes:
Numerals in Table 1 are residual strain values |Sr – St| ($\times 10^{-5}$).
NM means not measurable.

TABLE 2

Sample wafer with a residual strain value |Sr – St| of $2.3 \times 10^{-5}$ (maximum)

| | | Annealing maximum attained temperature (° C.) | | | | | | |
|---|---|---|---|---|---|---|---|---|
| | | 700 | 800 | 900 | 1000 | 1100 | 1150 | 1200 |
| Temperature gradient in crystal (° C./cm) | 0–2.5 | 2.3 | 2.3 | 1.4 | 1.3 | 1.1 | 1.2 | NM |
| | 2.5–5.0 | 2.3 | 2.2 | 1.4 | 1.3 | 1.2 | 1.3 | NM |
| | 5.0–7.5 | 2.3 | 2.3 | 1.4 | 1.5 | 1.4 | 1.5 | NM |
| | 7.5–10.0 | 2.3 | 2.3 | 1.5 | 1.5 | 1.3 | 1.5 | NM |
| | 10.0–12.5 | 2.3 | 2.3 | 1.6 | 1.7 | 1.6 | 1.7 | NM |
| | 12.5–15.0 | 2.3 | 2.3 | 2.1 | 2.1 | 1.9 | 1.9 | NM |
| | >15.0 | 2.3 | 2.3 | 2.2 | 2.0 | 1.9 | 1.9 | NM |

Notes:
Numerals in Table 2 are residual strain values |Sr – St| ($\times 10^{-5}$).
NM means not measurable.

TABLE 3

Sample wafer with a residual strain value |Sr – St| of $1.5 \times 10^{-5}$ (minimum)

| | | Annealing maximum attained temperature (° C.) | | | | | | |
|---|---|---|---|---|---|---|---|---|
| | | 700 | 800 | 900 | 1000 | 1100 | 1150 | 1200 |
| Temperature gradient in crystal (° C./cm) | 0–2.5 | 1.5 | 1.4 | 0.2 | 1.0 | 0.8 | 0.7 | 0.8 |
| | 2.5–5.0 | 1.5 | 1.5 | 1.1 | 1.0 | 0.9 | 0.8 | NM |
| | 5.0–7.5 | 1.5 | 1.5 | 1.1 | 1.0 | 0.9 | 0.9 | NM |
| | 7.5–10.0 | 1.5 | 1.5 | 1.4 | 1.3 | 1.2 | 1.0 | NM |
| | 10.0–12.5 | 1.5 | 1.5 | 1.4 | 1.4 | 1.3 | 1.2 | NM |
| | 12.5–15.0 | 1.5 | 1.5 | 1.5 | 1.5 | 1.4 | 1.4 | NM |
| | >15.0 | 1.5 | 1.5 | 1.5 | 1.5 | 1.5 | 1.5 | NM |

Notes:
Numerals in Table 3 are residual strain values |Sr – St| ($\times 10^{-5}$).
NM means not measurable.

In Tables 1 to 3, shaded cells show annealing conditions that the residual strain value is improved lower than before the annealing and the |Sr–St| meets $1.8 \times 10^{-5}$ or less. Meanwhile, "NM (not measurable)" therein means that the measurement cannot be conducted since temperature on the crystal surface is raised to a melting point of GaAs due to the overshooting of a heater in an annealing furnace used, so that the crystal surface is melted.

In view of Tables 1 to 3, in all samples, the annealing conditions to attain that the residual strain value is improved lower than before the annealing and the |Sr–St| meets $1.8 \times 10^{-5}$ or less are a maximum attained temperature of 900° C. or more and 1150° C. or less and a temperature gradient of 0° C./cm or more and 12.5° C./cm or less in the crystal during the annealing. Thus, the annealing conditions are optimized as described earlier.

The method of making a semiconductive GaAs wafer of the invention is characterized by that, even from a GaAs single crystal made by the LEC method, a semiconductive GaAs wafer can be obtained that the incidence of slip dislocation is suppressed in the activation annealing after the ion implantation. Also, from GaAs single crystal made by the vertical melt method, a semiconductive GaAs wafer can be obtained that the in-wafer plane dislocation density (=EPD) and the in-wafer plane residual strain value |Sr−St| fall within the above-defined range.

The invention can be applied to a semiconductive GaAs wafer with a diameter of 10.16 cm (=4 inches) or more as well as one with a diameter of 15.24 cm (=6 inches) or more.

EXAMPLES

From semiconductive GaAs wafers with a diameter of 15.24 cm (=6 inches), wafers are chosen in terms of two parameters, EPD and residual strain. The wafers are subjected to the annealing experiment to check the incidence of slip dislocation. According to the EPD value, the wafers of 30,000/cm$^2$ to 100,000/cm$^2$ are made by the LEC method and the wafers of less than 30,000/cm$^2$ are made by the VGF method. The wafers with an EPD of 30,000/cm$^2$ to 100,000/cm$^2$ by the LEC method are prepared by controlling the temperature gradient in the crystal during the crystal growth to be 20° C./cm or more and 150° C./cm. The wafers with an EPD of less than 30,000/cm$^2$ by the VGF method are prepared by controlling the temperature gradient in the crystal during the crystal growth to be less than 20° C./cm. Further, with regard to the in-wafer plane residual strain, according to residual strain values needed for the experiment, the wafer samples for the experiment are prepared by conducting the annealing in the above-defined range or not conducting it after the crystal growth.

A method of making the GaAs single crystal used in the experiment will be explained below.

First, a method of making the GaAs single crystal by the LEC method will be explained referring to FIG. 1.

Ga, As and boron trioxide 6 for preventing As volatilization are charged in the crucible 5 of PBN as a container for the raw materials. Then, the crucible 5 is placed in the chamber 2. The weights of the charge materials are Ga: 15,000 g, As: 16,500 g and boron trioxide: 2,000 g. The seed crystal 7 as a crystal source is attached to the tip of the pulling shaft 3. After the raw materials are placed in the chamber 2, the chamber 2 is vacuumed and then charged with inert gas. Then, the resistance heater 8 built in the chamber 2 is fed with current to increase the inside temperature of the chamber 2 so that Ga and As are reacted to synthesize GaAs. Then, by further increasing the temperature, GaAs melt 9 is obtained. Then, the pulling shaft 3 and the crucible shaft 4 are rotated inversely to each other. In this state, the pulling shaft 3 descends until the seed crystal 7 attached to the tip thereof contacts the GaAs melt 9. Then, the pulling shaft 3 is raised at a constant rate while lowering gradually the setting temperature of the resistance heater 8. Thereby, the crystal diameter increases gradually from the seed crystal to form a crystal shoulder. When a target crystal outside diameter is obtained after forming the crystal shoulder, its shape control is conducted to keep the outside diameter to obtain a GaAs single crystal 10. In the process of growing the GaAs single crystal from the seed crystal, the temperature gradient in the GaAs single crystal 10 during the crystal growth is controlled by adjusting the preset temperature or shape of the resistance heater 8, the inside member structure of the chamber 2 etc.

Figure 2:
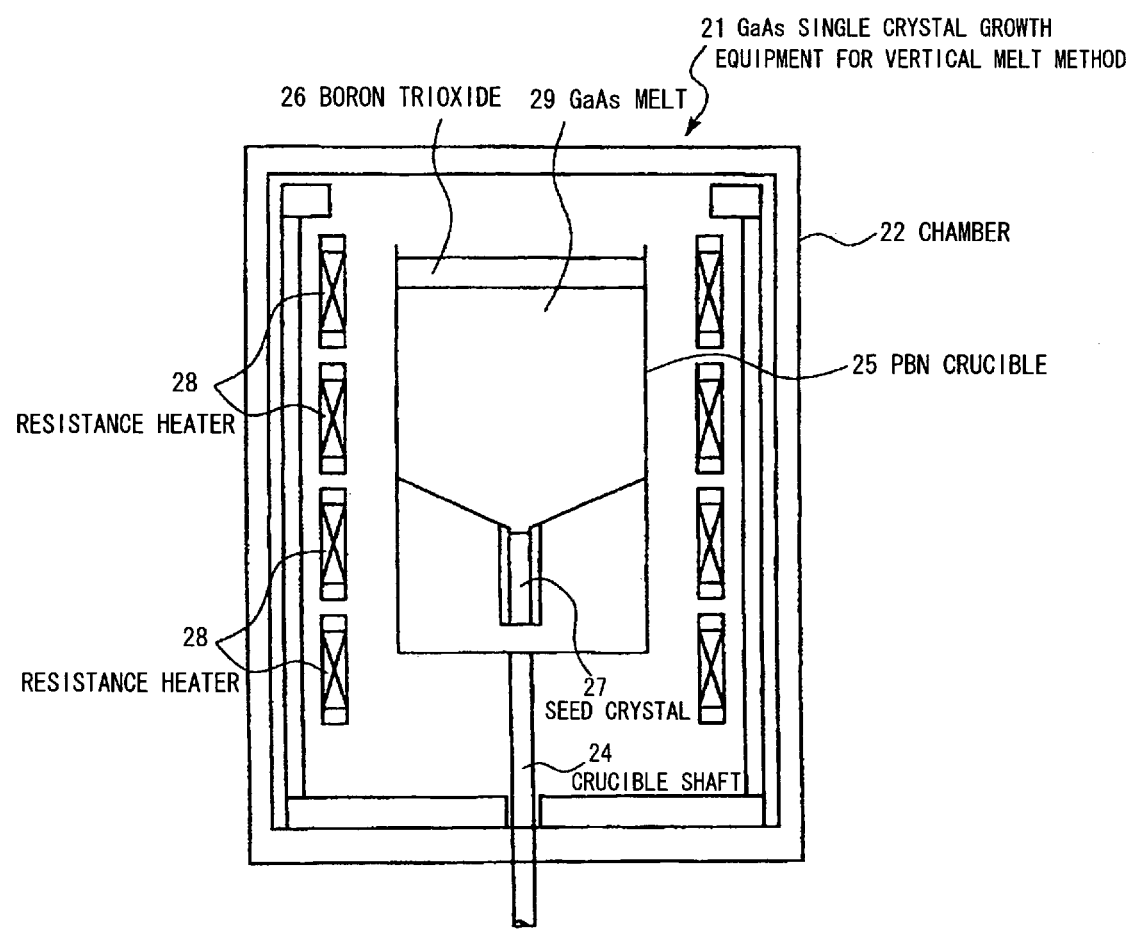
FIG. 2 is a schematic side view showing a GaAs single crystal growth equipment for the vertical melt method (VB method and VGF method)

Next, a method of making the GaAs single crystal by the vertical melt method will be explained below referring to FIG. 2.

GaAs polycrystal and boron trioxide 26 for preventing As volatilization are charged in the crucible 25 of PBN as a container for the raw materials. The weights of the charge materials are GaAs polycrystal: 20,000 g and boron trioxide: 2,000 g. The seed crystal 27 as a crystal source is attached inside a reduced diameter part at the bottom of the crucible 25. Then, the crucible 25 is placed in the chamber 22. Then, the chamber 22 is vacuumed and then charged with inert gas. Then, the resistance heater 28 built in the chamber 22 is fed with current to increase the inside temperature of the chamber 2 while forming a temperature gradient that temperature increases from the bottom toward the top. Thereby, the GaAs polycrystal is melted to have GaAs melt 29. Then, the seeding is conducted such that the furnace temperature is further increased until the GaAs melt 29 contacts the seed crystal 27 attached to the bottom of the crucible 25. Then, the setting temperature of the resistance heater 28 lowers at a constant rate such that the GaAs melt 29 is solidified from the seed crystal 27 to obtain a GaAs single crystal. In this experiment, the temperature gradient inside the furnace is set to be 20° C./cm or less.

The GaAs single crystals by the two methods as described above are sliced, beveled and polished to obtain GaAs wafers.

Figure 3:
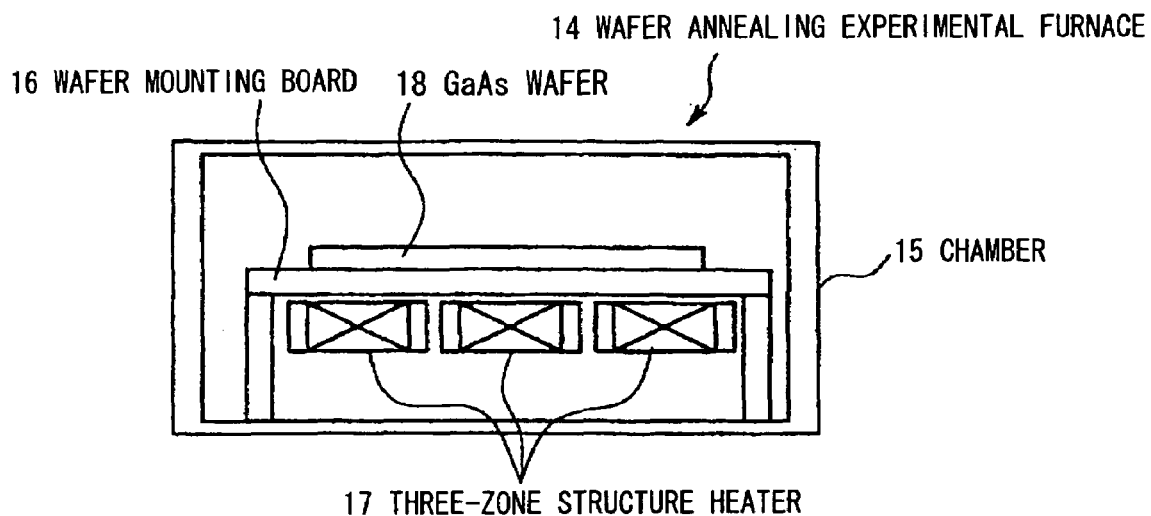
FIG. 3 is a schematic side view showing an experimental furnace for wafer annealing.

Next, the annealing experiment is conducted by using a wafer annealing experimental furnace 14 as shown in FIG. 3.

The wafer annealing experimental furnace is provided with a wafer mounting board 16 inside of a chamber 15 to put a GaAs wafer 18 thereon. Further, it is provided with a three-zone structure heater 17 that three heating zones are disposed laterally. The three heating zones of the three-zone structure heater 17 are disposed corresponding to the both ends and center of the GaAs wafer 18. The temperature distribution in the wafer plane can be arbitrarily controlled by adjusting the heater setting temperature at the three heating zones.

In this experiment, the temperature of the wafer annealing experimental furnace 14 is set to be 850° C. at the center of the wafer, 830° C. at the both ends such that a temperature difference of 20° C. is between the center and the end in the wafer plane. Time to attain the setting temperature is 30 min., retention time after the attainment is 5 min., and time to cool down to room temperature after that is 1 hour.

The experiment is conducted to the plural wafers that the parameters, EPD and residual strain are combined under the above temperature conditions. For example, the wafer samples comprise combinations of 0.8, 1, 3, 5, 8 and 10 (×10$^4$/cm$^2$) in EPD in the wafer plane and 0.9 to 2.0 (×10$^{-5}$) in residual strain value |Sr−St| in the wafer plane. The experiment is conducted by preparing 10 wafers for each combination of EPD and residual strain to check the incidence of slip dislocation. The result of the experiment is as shown in Table 4.

TABLE 4

Incidence of slip dislocation during annealing

| | | In-wafer plane EPD value (×10$^4$/cm$^2$) | | | | | |
|---|---|---|---|---|---|---|---|
| | | 0.8 | 1 | 3 | 5 | 8 | 10 |
| In-wafer plane residual | 0.9 | 50 | 40 | 10 | 0 | 0 | 0 |
| strain |Sr − St| value(×10$^{-5}$) | 1.0 | 50 | 40 | 20 | 0 | 0 | 0 |

TABLE 4-continued

Incidence of slip dislocation during annealing

| | In-wafer plane EPD value (×10⁴/cm²) | | | | | |
|---|---|---|---|---|---|---|
| | 0.8 | 1 | 3 | 5 | 8 | 10 |
| 1.2 | 60 | 50 | 20 | 10 | 0 | 0 |
| 1.5 | 60 | 50 | 20 | 10 | 0 | 0 |
| 1.8 | 70 | 60 | 20 | 10 | 0 | 0 |
| 2.0 | 80 | 70 | 50 | 40 | 30 | 30 |

Notes:
Numerals in Table 4 are incidences (%) of slip dislocation.
In-wafer plane residual strain value |Sr − St| is obtained by photoelastic measurement.

In view of Table 4, in the range (shaped region therein) to meet an in-wafer plane EPD value of 30,000/cm² or more and 100,000/cm² and an in-wafer plane residual strain value |Sr–St| of $1.8 \times 10^{-5}$ or less, the incidence of slip dislocation is 20% at the maximum. This result proves the effectiveness of the invention.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductive GaAs wafer comprising:
   a diameter of 4 inches or more;
   an in-wafer plane dislocation density of 30,000/cm² or more and 100,000/cm² or less; and
   an in-wafer plane residual strain value |Sr–St| of $1.8 \times 10^{-5}$ or less, where the in-wafer plane residual strain valve |Sr–St| is measured by using a photoelastic phenomenon that a polarization plane is rotated according to a intensity of a stress.

2. A method of making a semiconductive GaAs wafer, comprising:
   growing a GaAs single crystal under a temperature gradient of 20° C./cm or more and 150° C./cm or less formed in the crystal so that the semiconductive GaAs wafer comprises an in-wafer plane dislocation density of 30,000/cm² or more and 100,000/cm² or less.

3. The method according to claim 2, further comprising:
   annealing the GaAs single crystal after the GaAs single crystal growing step.

4. The method according to claim 3, wherein:
   the annealing comprises a maximum attained temperature of 900° C. or more and 1150° C. or less so that the semiconductive GaAs wafer comprises an in-wafer plane residual strain value |Sr–St| of $1.8 \times 10^{-5}$ or less.

* * * * *